(12) United States Patent
Girard et al.

(10) Patent No.: US 6,810,897 B2
(45) Date of Patent: Nov. 2, 2004

(54) PROCESS GAS SUPPLY MECHANISM FOR ALCVD SYSTEMS

(75) Inventors: Jean-Marc Girard, Paris (FR); Takako Kimura, Ibaraki Prefecture (JP)

(73) Assignee: L'Air Liquide, Societe Anonyme a Directoire et Conseil de Surveillance pour l'Etude et l'Exploitation des Procedes Georges Claude, Paris (FR)

( * ) Notice: Subject to any disclaimer, the term of this patent is extended or adjusted under 35 U.S.C. 154(b) by 347 days.

(21) Appl. No.: 10/147,062

(22) Filed: May 17, 2002

(65) Prior Publication Data

US 2002/0170598 A1 Nov. 21, 2002

(30) Foreign Application Priority Data

May 18, 2002 (JP) ........................................ 2001-149292

(51) Int. Cl.[7] ........................ B08B 5/00; C23C 16/448; C23C 16/455; C23C 16/46; G05D 7/06
(52) U.S. Cl. ............................. 137/2; 134/1.2; 134/1.3; 117/89; 117/93; 117/102; 427/255.23; 427/255.28; 137/15.04
(58) Field of Search ........................... 137/2, 5.04, 5.05, 137/240, 486, 489.5; 134/1.2, 1.3; 117/89, 93, 97, 98, 102; 118/715, 720; 216/58; 427/248.1, 255.23, 255.28; 438/689, 692

(56) References Cited

U.S. PATENT DOCUMENTS

| | | | | |
|---|---|---|---|---|
| 4,917,136 A | * | 4/1990 | Ohmi et al. | ................ 137/240 |
| 5,281,274 A | * | 1/1994 | Yoder | ......................... 118/697 |
| 5,313,982 A | * | 5/1994 | Ohmi et al. | ................ 137/597 |
| 5,865,205 A | * | 2/1999 | Wilmer | ......................... 137/2 |
| 6,270,572 B1 | * | 8/2001 | Kim et al. | .................... 117/93 |
| 6,296,026 B1 | * | 10/2001 | Gregg et al. | ................ 137/240 |
| 6,302,139 B1 | * | 10/2001 | Dietz | ......................... 137/240 |
| 6,457,494 B1 | * | 10/2002 | Gregg et al. | ................ 137/240 |
| 6,511,539 B1 | * | 1/2003 | Raaijmakers | ............... 117/102 |
| 6,562,140 B1 | * | 5/2003 | Bondestam et al. | ........ 118/715 |
| 6,579,374 B2 | * | 6/2003 | Bondestam et al. | ........ 118/725 |

FOREIGN PATENT DOCUMENTS

EP        0 664 449 B1     6/2000

OTHER PUBLICATIONS

Morishita et al, "Atomic–layer chemical–vapor–deposition of silicon–nitride"; *Applied Surface Science* 112 (1997) pp. 198–204.

Pathangey et al, "Atomic Layer Deposition for Nanoscale Thin Film Coatings"; *Vacuum Technolgy & Coating*, May 2000, pp. 33–41.

* cited by examiner

*Primary Examiner*—George L. Walton
(74) *Attorney, Agent, or Firm*—Burns, Doane, Swecker & Mathis, L.L.P.

(57) ABSTRACT

To provide a process gas supply mechanism for ALCVD systems that enables the high speed switching of process gases without accompanying particulate contamination of the treatment substrate. The ALCVD system is provided with a CVD treatment section and a process gas supply section. The process gas supply section contains a reactant gas line and a carrier gas line; these are combined to form a joint flow line. A vent line is connected to the reactant gas line upstream from the joint flow position. A stop valve SV and a needle valve NV are disposed in the vent line. This needle valve NV functions as a setting means in order to set the flow rate of the gas flowing in the vent line. The stop valve SV is driven through repetitive switching operations by a drive control element, thereby effecting supply and nonsupply of the reactant gas.

26 Claims, 5 Drawing Sheets

PROCESS GAS SUPPLY MECHANISM FOR ALCVD SYSTEMS

This application claims priority under 35 U.S.C. §§119 and/or 365 to 2001-149292 filed in Japan on May 18, 2001; the entire content of which is hereby incorporated by reference.

BACKGROUND OF THE INVENTION

1. Field of the Invention

This invention relates to a process gas supply mechanism for use in atomic layer chemical vapor deposition (ALCVD) systems. More particularly, this invention relates to a process gas supply mechanism for ALCVD systems that can switch between the supply and nonsupply of a process gas or can effect high speed switching between or among the feed of a plural number of process gases.

2. Description of the Prior Art

The treatment operating modes used by CVD systems can be broadly classified into batch modes and continuous inflow modes. There is no requirement for flow rate control means for either the reactant gas or carrier gas when a CVD system is operated in a batch mode. In the batch mode, process gas is first supplied to the treatment compartment until the pressure reaches a specified value and the process gas supply line is then closed. The treatment compartment is subsequently exhausted by opening the exhaust line (see Morishita et al., Applied Surface Science, 112 (1997), pp. 198–204).

When a CVD system is operated in a continuous inflow mode, the gas flow rate can be controlled by using a capillary in each of the process gas supply lines (Pathangey et al., Vacuum Technology & Coating, May, 2000, pp. 33–41). The gas supplied to the treatment compartment is switched by the opening and closing of a valve for each gas. A mass flow controller can be used for control instead of a capillary, but a capillary offers the advantage of instantaneous stabilization of the gas flow.

In another mechanism known for supplying process gas to a device such as a CVD or epitaxial treatment compartment, the flow rate is stabilized by a line that branches the gas prior to supply of the gas. This mechanism uses a branch T-structure equipped with a pair of valves in order to direct the process gas to the treatment compartment or to the treatment compartment bypass. The two valves comprise the combination of a NO valve (valve normally open) and an NC valve (valve normally closed) and are simultaneously switched by the same signal.

A similar technology is disclosed in EP 0 664 449 B1 (Ronge et al.). Here, all or part of gas containing trace level impurity is mixed or branched into a diluent gas. In order to control the degree of dilution by adjusting the branched flow rate, a mass flow controller is disposed in the branch line, that is, in offline position. A zero gas condition is realized by branching all of the impurity-containing auxiliary flow. In this technology, the total flow rate of impurity-containing gas is restricted by orifices and the branched flow rate is controlled by a mass flow controller.

Problems to be Solved by the Invention

ALCVD processing is known as one form of CVD processing. In a typical ALCVD process, a first reactant gas and a second reactant gas are alternately fed into a treatment compartment with rapid alternation thereinbetween. This results in repetitive gas adsorption and reaction on the treatment substrate with the formation of a desired film through atomic layer-by-atomic layer deposition (atomic layer deposition). At the present time standard gas manifolds are used in CVD systems that carry out ALCVD processing.

The following problems are identified when one considers batch mode execution of ALCVD processing. First, evacuation and cyclic purging of the treatment compartment are required after supply of a first reactant gas into the treatment compartment and prior to supply of a second reactant gas. This yields a process that requires fairly long periods of time given the number of switching operations (from 20 to 1,000) required for ALCVD. Second, the number of operations by the inline valve (valve in the gas supply line to the treatment compartment) is also increased. Since particles are produced by the operation of a valve, the probability of contamination of the treatment substrate increases in direction proportion to the number of valve operations. The probability of contamination of the treatment substrate is therefore substantially raised when one considers the batch mode execution of ALCVD processing.

The following problems are identified when one considers execution of ALCVD processing by the continuous inflow mode. First, the number of inline valve operations is again an important factor in this mode. Second, taking as an example a structure as in the apparatus of Pathangey et al., supra, the gas may undergo nonuniform flow until the pressure stabilizes. Specifically, the gas may flow at a high flow rate immediately upon opening of the valve in the reactant gas line, and the flow rate may thereafter undergo a gradual stabilization. Third, when the valve closes, the reactant gas flow declines as the capillary empties, and the time required for this represents a period of equipment underutilization. Moreover, since lengthy time intervals are required for process stabilization at each step, the overall sequence requires substantial amounts of time.

SUMMARY OF THE INVENTION

This invention was developed in view of the problems delineated above for the prior art. The object of this invention is to provide a process gas supply mechanism for ALCVD systems which enables switching between process gas supply and nonsupply, or which can carry out high speed switching of the supply of a plural number of process gases, and which can in any case effect said switching without accompanying particulate contamination of the treatment substrate.

Means Solving the Problems

The first aspect of this invention is a process gas supply mechanism for ALCVD systems, wherein the ALCVD system is provided with a gastight treatment compartment that holds the treatment substrate and with a vacuum exhaust section that can exhaust said treatment compartment and is connected to the treatment compartment through an exhaust line, and wherein the process gas supply mechanism is connected to the treatment compartment in order to feed process gas into the treatment compartment, said process gas supply mechanism being characteristically provided with a first reactant gas line that can supply a flow rate-regulated first reactant gas;

a first auxiliary gas line that can supply a flow rate-regulated first auxiliary gas;

a first vent line, which is connected to the first reactant gas line upstream from a first position at which the first reactant gas flow is combined with the first auxiliary gas flow;

a first vent setting means that is disposed in the first vent line and that can set the flow rate vf1 of the gas flowing in the first vent line so as to satisfy the condition $mf1 < vf1 < sf1 + mf1$ wherein mf1 is the flow rate of the first reactant gas supplied from the first reactant gas line and sf1 is the flow rate of the first auxiliary gas supplied from the first auxiliary gas line;

a first vent switching means that is disposed in the first vent line and that can open and close the first vent line; and a first drive control means that drives the first vent switching means in such a manner that the first vent switching means carries out its switching operation repetitively.

The second aspect of this invention has as its characteristic feature the additional provision in the mechanism of the first aspect of a first joint flow line that can supply gas to the treatment compartment and that is formed by the combination at the aforesaid first position of the first reactant gas line and the first auxiliary gas line.

The third aspect of this invention characteristically comprises the mechanism of the first or second aspect with the additional disposition therein of a second reactant gas line that can supply a flow rate-regulated second reactant gas; a second auxiliary gas line that can supply a flow rate-regulated second auxiliary gas; a second joint flow line, which supplies gas to the treatment compartment and is formed by the combination at a second position of the second reactant gas line and the second auxiliary gas line; a second vent line, which is connected to the second reactant gas line upstream from said second position; a second vent setting means that is disposed in the second vent line and that can set the flow rate vf2 of the gas flowing in the second vent line so as to satisfy the condition mf2<vf2<sf2+mf2 wherein mf2 is the flow rate of the second reactant gas supplied from the second reactant gas line and sf2 is the flow rate of the second auxiliary gas supplied from the second auxiliary gas line; a second switching means that is disposed in the second vent line and that can open and close the second vent line; and a second drive control means that drives the second switching means in such a manner that the second switching means repetitively effects its switching operation in a regime synchronized with the switching operation of the first switching means that provides a switched state opposite from that of the first switching means.

The fourth aspect of this invention is a process gas supply mechanism for ALCVD systems, wherein the ALCVD system is provided with a gastight treatment compartment that holds the treatment substrate and with a vacuum exhaust section that exhausts said treatment compartment and is connected to the treatment compartment through an exhaust line, and wherein the process gas supply mechanism is connected to the treatment compartment in order to feed process gas into the treatment compartment, said process gas supply mechanism being characteristically provided with a first reactant gas line that can supply a flow rate-regulated first reactant gas; a first auxiliary gas line that can supply a flow rate-regulated first auxiliary gas; a first joint flow line that supplies gas to the treatment compartment and is formed by the combination at a first position of the first reactant gas line and the first auxiliary gas line; a first reactant gas vent line, which is connected to the first reactant gas line upstream from the first position; a first auxiliary gas vent line, which is connected to the first auxiliary gas line upstream from the first position; a first reactant gas vent setting means that is disposed in the first reactant gas vent line and that can set the flow rate vf1m of the gas flowing in the first reactant gas vent line so as to satisfy the condition mf1<vf1m<mf1+sf1 wherein mf1 is the flow rate of the first reactant gas supplied from the first reactant gas line and sf1 is the flow rate of the first auxiliary gas supplied from the first auxiliary gas line; a first auxiliary gas vent setting means that is disposed in the first auxiliary gas vent line and that can set the flow rate vf1s of the gas flowing in the first auxiliary gas vent line so as to satisfy the condition sf1<vf1s<sf1+mf1; a first reactant gas vent switching means that is disposed in the first reactant gas vent line and that can open and close the first reactant gas vent line; a first auxiliary gas vent switching means that is disposed in the first auxiliary gas vent line and that can open and close the first auxiliary gas vent line; and a first drive control means that drives the first reactant gas vent switching means and the first auxiliary gas vent switching means, in such a manner that the first reactant gas vent switching means and the first auxiliary gas vent switching means carry out their switching operations repetitively in a regime synchronized to each other that provides opposite switched states for the two means.

The fifth aspect of this invention characteristically comprises the mechanism of the fourth aspect with the additional disposition therein of a second reactant gas line that can supply a flow rate-regulated second reactant gas; a second auxiliary gas line that can supply a flow rate-regulated second auxiliary gas; a second joint flow line, which supplies gas to the treatment compartment and is formed by the combination at a second position of the second reactant gas line and the second auxiliary gas line; a second reactant gas vent line, which is connected to the second reactant gas line upstream from said second position; a second auxiliary gas vent line, which is connected to the second auxiliary gas line upstream from said second position; a second reactant gas vent setting means that is disposed in the second reactant gas vent line and that can set the flow rate vf2m of the gas flowing in the second reactant gas vent line so as to satisfy the condition mf2<vf2m<mf2+vf2 wherein mf2 is the flow rate of the second reactant gas supplied from the second reactant gas line and vf2 is the flow rate of the second auxiliary gas supplied from the second auxiliary gas line; a second auxiliary gas vent setting means that is disposed in the second auxiliary gas vent line and that can set the flow rate vf2s of the gas flowing in the second auxiliary gas vent line so as to satisfy the condition vf2<vf2s<vf2+mf2; a second reactant gas vent switching means that is disposed in the second reactant gas vent line and that can open and close the second reactant gas vent line; a second auxiliary gas vent switching means that is disposed in the second auxiliary gas vent line and that can open and close the second auxiliary gas vent line; and a second drive control means that can drive the second reactant gas vent switching means and the second auxiliary gas vent switching means, in such a manner that the second reactant gas vent switching means and the second auxiliary gas vent switching means carry out their switching operations repetitively in a regime synchronized to each other that provides opposite switched states for the two means and synchronized to the switching operations of the first reactant gas vent switching means and the first auxiliary gas vent switching means and providing opposite switched states therefrom.

The sixth aspect of this invention characteristically comprises the mechanism of the fifth aspect with the additional disposition therein of a supply line which is formed by the combination at a third position of the first and second joint flow lines and which supplies gas to the treatment compartment; a first supply vent line, which is connected to the first joint flow line upstream from the third position; a second supply vent line, which is connected to the second joint flow line upstream from the third position; a first supply vent setting means, which is disposed in the first supply vent line and can set the flow rate f3a of the gas flowing in the first supply vent line so as to satisfy the condition f1<f3a<f1+f2 wherein f1 is the flow rate of the gas supplied from the first joint flow line and f2 is the flow rate of the gas supplied from the second joint flow line; a second supply vent setting means, which is disposed in the second supply vent line and can set the flow rate f3b of the gas flowing in the second supply vent line so as to satisfy the condition f2<f3b<f2+f1; a first supply vent switching means that is disposed in the first supply vent line and that can open and close the first supply vent line; a second supply vent switching means that is disposed in the second supply vent line and that can open and close the second supply vent line; and a third drive control means that can drive the first supply vent switching means and the second supply vent switching means through repetitive switching operations according to a regime in which the first supply vent switching means and the second supply vent switching means are synchronized and in opposite.

The seventh aspect of this invention characteristically comprises the mechanism of the sixth aspect in which the first and second supply vent lines are combined to form a common vent line and the first and second supply vent setting means comprise a common setting means that is disposed in the common vent line.

The eighth aspect of this invention characteristically comprises a mechanism according to any of the fourth to seventh aspects in which the reactant gas vent line and the auxiliary gas vent line are combined to form a joint flow vent line and the reactant gas vent setting means and auxiliary gas vent setting means comprise a common setting means that is disposed in said joint flow vent line.

The ninth aspect of this invention characteristically comprises a mechanism according to any of the third and fifth through seventh aspects, in which the first and second joint flow lines are themselves combined and thereafter connected to the treatment compartment through a supply line, and in which the process gas supply mechanism is additionally provided with a common pressure setting means that is disposed in the aforesaid supply line and can set the pressure in the first and second joint flow lines.

The tenth aspect of this invention characteristically comprises a mechanism according to any of the third, fifth through seventh, and ninth aspects, in which the first and second auxiliary gas lines branch from a common main line and a flow rate control means is disposed in said main line.

The eleventh aspect of this invention characteristically comprises a mechanism according to any of the third, fifth through seventh, ninth, and tenth aspects in which the first and second drive control means are provided with a common drive control element.

The twelfth aspect of this invention characteristically comprises a mechanism according to any of the first through eleventh aspects in which a pressure setting means is additionally disposed in the joint flow line in order to set the pressure in said joint flow line.

The thirteenth aspect of this invention characteristically comprises the mechanism according to the twelfth aspect in which the pressure setting means comprises an automatic pressure regulator that maintains the pressure within the joint flow line at a set pressure.

The fourteenth aspect of this invention characteristically comprises a mechanism according to any of the first through thirteenth aspects in which the vent switching means and vent setting means disposed in the same vent line comprise separate members and said vent switching means is disposed upstream from said vent setting means.

The fifteenth aspect of this invention characteristically comprises a mechanism according to any of the first through fourteenth aspects in which the vent setting means comprises a device that can alter the flow rate of the gas flowing in the vent line.

The sixteenth aspect of this invention characteristically comprises a mechanism according to any of the first through fifteenth aspects in which the vent line is connected to the exhaust line.

Figure 1:
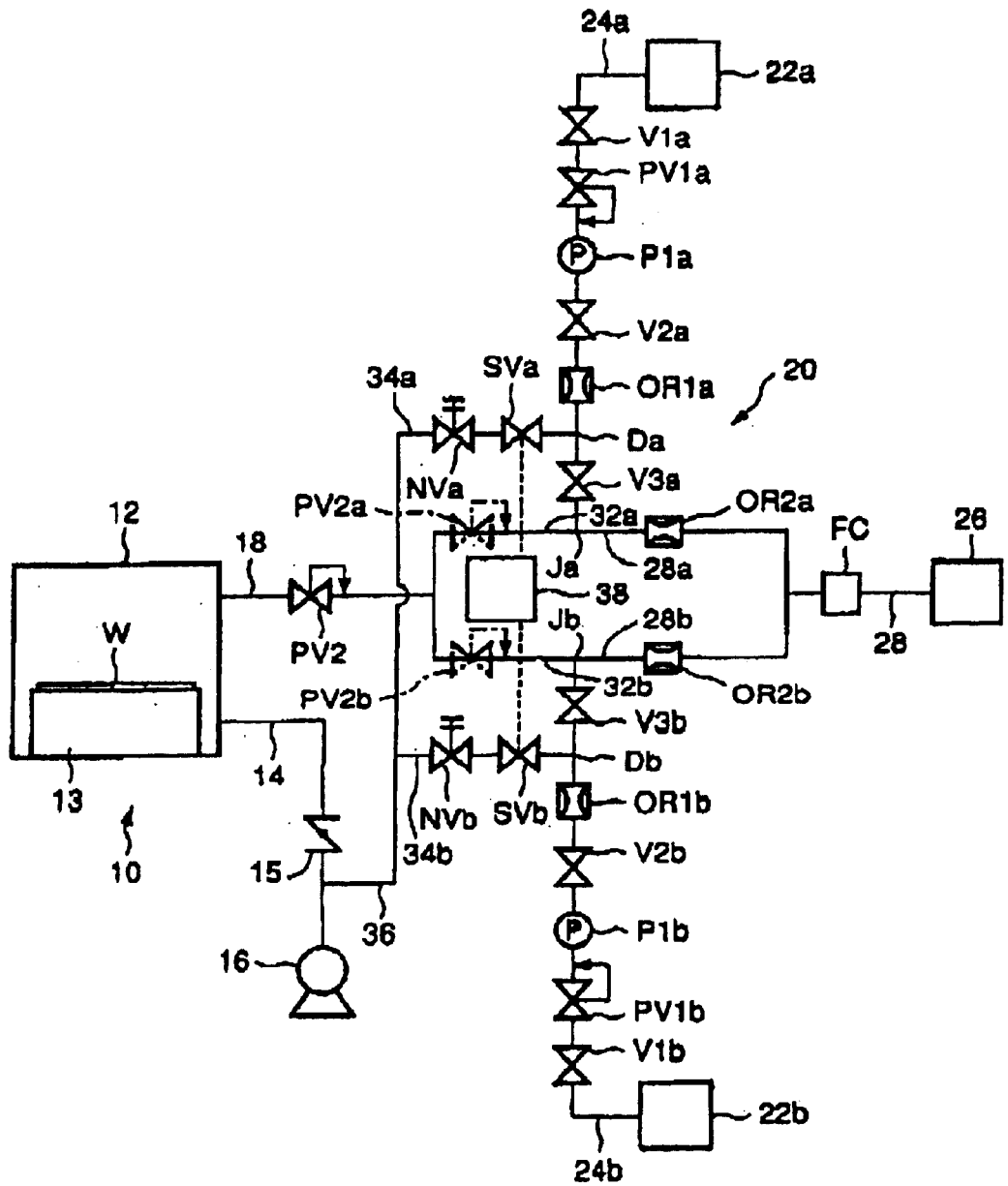
FIG. 1 contains a schematic drawing of the conduit layout of an ALCVD system that employs a process gas supply mechanism that is an embodiment of this invention.

Reference Symbols
10 . . . CVD treatment section
12 . . . treatment compartment
13 . . . susceptor
14 exhaust line
16 vacuum exhaust element
18 . . . supply line
20 . . . process gas supply section
24a, 24b . . . first and second reactant gas lines
28a, 28b first and second carrier gas lines
32a, 32b . . . first and second joint flow lines
34a, 34b . . . first and second vent lines
38 . . . drive control element
PV1a, PV1b, PV2 . . . pressure-control valve
OR1a, OR1b, OR2a, OR2b . . . orifices
FC . . . mass flow controller
SVa, SVb . . . stop valve
NVa, NVb . . . needle valve
60 . . . process gas supply section
60a, 60b . . . first and second supply sections
64 . . . reactant gas line
68 . . . purge gas line
72a, 72b . . . first and second joint flow lines
74 . . . reactant gas vent line
75 . . . purge gas vent line
78 . . . drive control element
82a, 82b . . . first and second supply vent lines
FC11, FC12 mass flow controller
SV11, SV12, SV21a, SV21b stop valve
NV11, NV12, NV13, NV20
NV21a, NV21b . . . needle valve

DETAILED DESCRIPTION OF THE PREFERRED EMBODIMENTS

The embodiments of this invention explore a variety of executions of this invention, and various embodiments of this invention can be derived by suitable combination of the plural number of disclosed constituent elements. For example, when an embodiment of the invention has been derived in which some constituent elements have been omitted from the overall set of constituent elements presented for the embodiment, these omitted elements can be suitably fulfilled by conventional well-known technologies in the actual working of the derived inventive embodiment.
Embodiments of the Invention Embodiments of this invention are explained below with reference to the drawings. In the description that follows, constituent elements that have approximately the same structure and function are assigned a common reference symbol and their description will be repeated only when necessary.

FIG. 1 contains a schematic drawing of the conduit layout of an ALCVD system that employs a process gas supply mechanism that is an embodiment of this invention. The system shown in FIG. 1 is provided with a CVD treatment section 10 and a process gas supply section 20. This process gas supply section 20 has a structure that switches between two reactant gases, which in each case are supplied mixed with a carrier gas.

The CVD treatment section 10 contains a gastight treatment compartment 12, and a susceptor 13 that holds and heats the semiconductor wafer W is disposed within the gastight treatment compartment 12. A vacuum exhaust element 16 is connected to the treatment compartment 12 through an exhaust line 14 in which a vacuum regulator 15 (e.g., a butterfly valve) is disposed; this vacuum exhaust element 16 functions to exhaust the interior of the treatment compartment 12 and to establish the desired vacuum therein. The process gas supply section 20 is also connected through the supply line 18 to the treatment compartment 12 in order to supply process gas to the interior thereof.

The process gas supply section 20 contains a first and second reactant gas lines 24a and 24b for the feed of first and second reactant gases to the treatment compartment 12 from the first and second reactant gas sources 22a and 22b. The process gas supply section 20 also contains a carrier gas main line 28 that feeds carrier gas to the treatment compartment 12 from the carrier gas source 26. The carrier gas main line 28 is divided along its course into two parallel first and second carrier gas lines 28a and 28b. The first reactant gas line 24a and the first carrier gas line 28a are joined at the position Ja to give the first joint flow line 32a. The second reactant gas line 24b and the second carrier gas line 28b are joined at the position Jb to give the second joint flow line 32b. The first and second joint flow lines 32a and 32b are themselves combined to give the supply line 18, which is connected to the treatment compartment 12.

It is not essential to the present invention that the first and second joint flow lines 32a and 32b be combined for connection to the treatment compartment 12. Depending on the nature of the first and second reactant gases, it may be desirable to connect the first and second joint flow lines 32a and 32b separately to the treatment compartment 12.

A first vent line 34a is connected to the first reactant gas line 24a at the branch position Da residing upstream from the joint flow position Ja. Similarly, a second vent line 34b is connected to the second reactant gas line 24b at the branch position Db residing upstream from the joint flow position Jb. The first and second vent lines 34a and 34b are joined along their courses to give a joint flow vent line 36. This joint flow vent line 36 is connected to the exhaust line 14 of the CVD treatment section 10 between the butterfly valve 15 and the vacuum exhaust element 16.

The following are disposed in the first reactant gas line 24a upstream from the branch position Da and in the sequence given considered from the upstream side: a valve V1a, a pressure-control valve PV1a, a pressure gauge P1a, a valve V2a, and a calibrated orifice OR1a. A separation valve V3a is disposed in the first reactant gas line 24a between the branch position Da and the joint flow position Ja. In the same manner, the corresponding elements V1b, PV1b, P1b, V2b, OR1b, and V3b are disposed at the corresponding positions in the second reactant gas line 24b. The elements PV1a and OR1a and the elements PV1b and OR1b function, respectively, as control means that regulate the flow rate of the first and second reactant gases in the first and second reactant gas lines 24a and 24b. A mass flow controller can also be used in place of the elements PV1a and OR1a and/or elements PV1b and OR1b.

A mass flow controller FC is disposed in the carrier gas main line 28 as a common flow rate control means for the first and second carrier gas lines 28a and 28b. Orifices OR2a and OR2b are provided, respectively, in the first and second carrier gas lines 28a and 28b, in each case upstream from the joint flow positions Ja and Jb. These elements enable control of the flow rate of the carrier gas flowing in the first and second carrier gas lines 28a and 28b.

A pressure-control valve PV2 (automatic pressure regulator) is provided in the supply line 18. This pressure-control valve PV2 functions to set and maintain the back pressure of the first and second joint flow lines 32a and 32b. The pressure-control valve PV2 can be omitted when a suitable pressure prevails within the treatment compartment 12.

A solenoid-driven stop valve SVa and a needle valve NVa are disposed in the first vent line 34a in the given sequence considered from the upstream side. In the same manner, the corresponding elements SVb and NVb are disposed at the corresponding positions in the second vent line 34b. The stop valves SVa and SVb function as switching means that can open and close the first and second vent lines 34a and 34b, respectively. The needle valves NVa and NVb function as devices that can change and set the flow rates of the gases flowing in, respectively, the first and second vent lines 34a and 34b, that is, they function as setting means. The stop valves SVa and SVb are desirably disposed upstream from the needle valves NVa and NVb in order to obtain a sharp and well-defined switching between the input of the first and second reactant gases to the treatment compartment 12 (the switching mode is discussed below).

During the CVD process the flow rate vf1 of the gas flowing in the first vent line 34a is set so as to satisfy the condition mf1<vf1<sf1+mf1 wherein mf1 is the flow rate of the first reactant gas supplied from the first reactant gas line 24a and sf1 is the flow rate of the first carrier gas supplied from the first carrier gas line 28a. In addition the flow rate vf2 of the gas flowing in the second vent line 34b is set so as to satisfy the condition mf2<vf2<sf2+mf2 wherein mf2 is the flow rate of the second reactant gas supplied from the second reactant gas line 24b and sf2 is the flow rate of the second carrier gas supplied from the second carrier gas line 28b.

In addition, the pressures within the first and second vent lines 34a and 34b at the outlets from the needle valves NVa and NVb are also set below the pressures within the first and second joint flow lines 32a and 32b, respectively. It is also desirable in this regard to ultimately connect the first and second vent lines 34a and 34b to the vacuum exhaust element 16 of the CVD treatment section 10. The first and second vent lines 34a and 34b may also each be connected to separate and independent exhaust elements.

The stop valves SVa and SVb are electrically driven through repetitive switching operations by the common drive control element 38. Drive control is effectuated in such a manner that the switching operations of the stop valves SVa and SVb are synchronized to each other and the two valves reside in switched states opposite from one another. The stop valves SVa and SVb can also be of a type driven by air pressure (pneumatically driven), in which case the drive control element 38 is changed to, for example, an air cylinder.

The method for switching between the first and second reactant gases in the ALCVD system of FIG. 1 will now be explained. FIGS. 2(a) through 2(d) contain drawings that illustrate the operations carried out in both the first and second supply sections for the first and second reactant gases. In order to simplify the explanation, the operation of the first and second supply sections will be explained with reference to only a single supply section since the two supply sections have entirely the same operation and principle, with the exception that their switched valves reside in opposite switched states. Therefore, in order to provide a common explanation applicable to both supply sections, the a and b suffixes have been omitted from the reference symbols for each element in FIGS. 2(a) through 2(d) and in the explanation of the operation provided below. For valves V1 through V3 and SV the open state is denoted by a blank symbol and the closed state is denoted by a hatched symbol.

The process gas supply section 20 is placed in an idle mode prior to starting the ALCVD treatment. The valves V1, V3, and SV are open and the valve V2 is closed in this idle mode (see FIG. 2(a)). As a result, reactant gas is not supplied from the reactant gas line 24 while carrier gas is supplied from the carrier gas line 28. A substream of the carrier gas Gc supplied from the carrier gas line 28 flows into the vent line 34 while the remainder flows into the joint flow line 32. This results in the flow of only carrier gas in the joint flow line 32 and the supply of only carrier gas to the treatment compartment 12. Likewise, only carrier gas flows in the vent line 34 during this period.

The process gas supply section 20 is placed in a ready mode just prior to starting the ALCVD treatment. The valve V2 is opened in this ready mode and the valves V1, V3, and SV also remain open at this point (see FIG. 2(b)). As specified above, the flow rate vf of the gas flowing in the vent line 34 is set at this point so as to satisfy the condition mf<vf<sf+mf wherein mf is the flow rate of the reactant gas supplied from the reactant gas line 24 and sf is the flow rate of the carrier gas supplied from the carrier gas line 28. The pressure at the outlet from the needle valve NV is also set to below the pressure within the joint flow line 32.

As a consequence of this configuration, all of the reactant gas Ga supplied from the reactant gas line 24 flows into the vent line 34 in the ready mode. In addition, a substream of the carrier gas Gc supplied from the carrier gas line 28 flows into the vent line 34 while the remainder flows into the joint flow line 32. Thus, during this period only carrier gas flows into the joint flow line 32 and is supplied to the treatment compartment 12, while reactant gas and carrier gas flow in the vent line 34. The apparatus is maintained in this ready mode until the reactant gas flow stabilizes.

The process gas supply section 20 is placed in process mode to begin the ALCVD treatment. This process mode commences with the closing of the valve SV while the valves V1 through V3 remain open (refer to FIG. 2(c)). This serves to stop the flow of gas into the vent line 34, with the result that all of the reactant gas Ga supplied from the reactant gas line 24 and all of the carrier gas Gc supplied from the carrier gas line 28 flow into the joint flow line 32. Thus, at this point the reactant gas is supplied mixed with carrier gas to the treatment compartment 12 through the joint flow line 32.

Figure 2A:
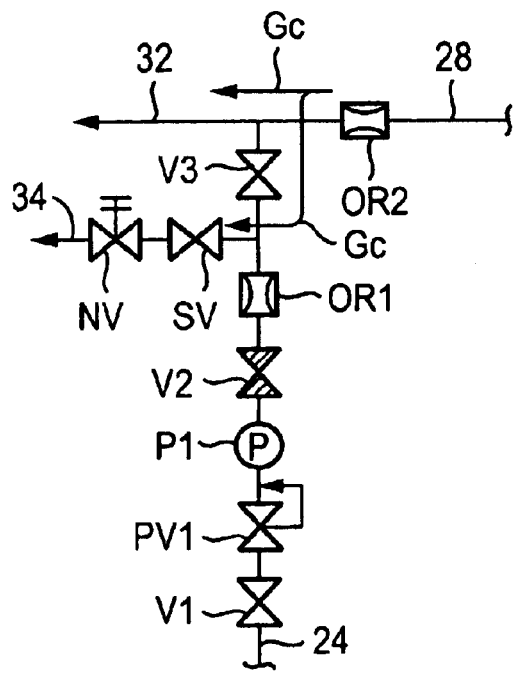
FIGS. 2(a) through (d) contain drawings that illustrate the operations that are carried out in the method for switching between the first and second reactant gases in the ALCVD system of FIG. 1.
Figure 2B:
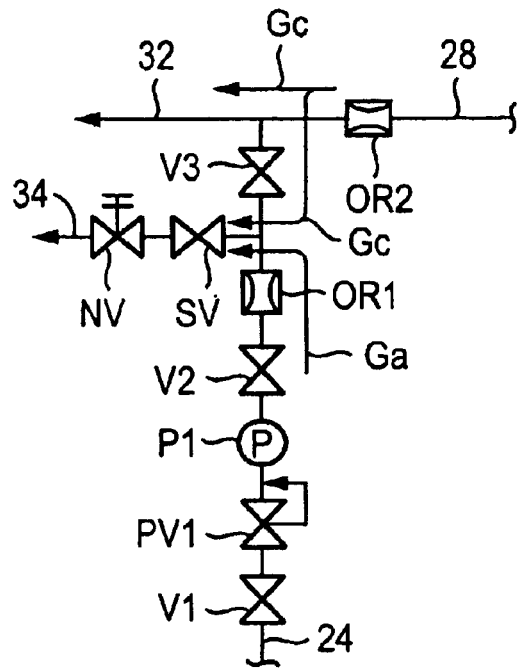
Figure 2C:
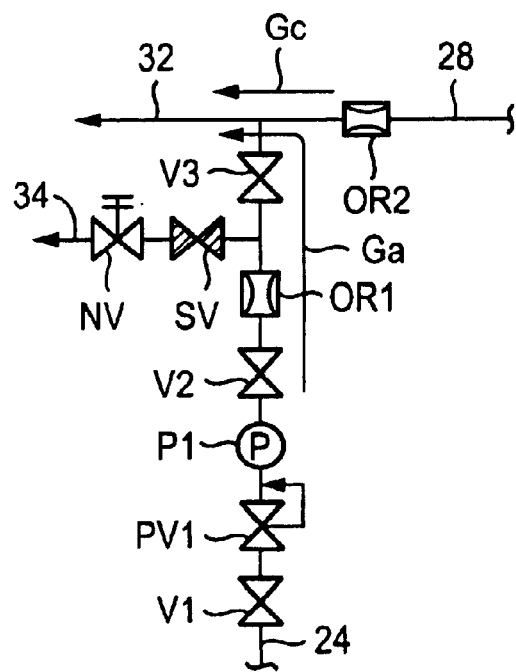
Figure 2D:
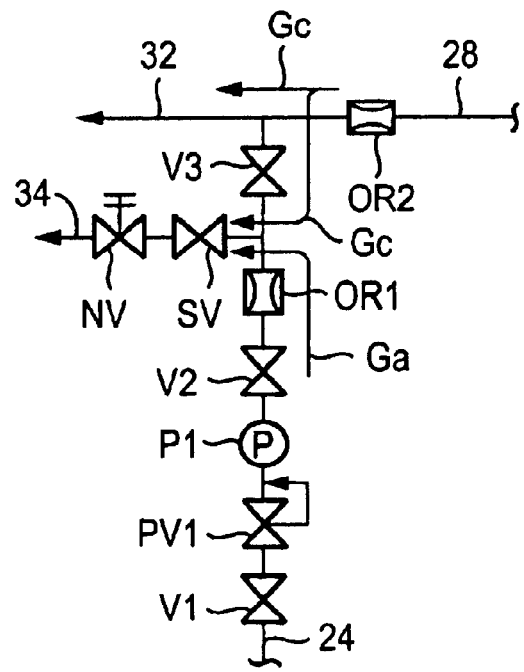

The valve SV is then opened while the valves V1 through V3 remain open (see FIG. 2(d)), which results in all of the reactant gas Ga supplied from the reactant gas line 24 again flowing into the vent line 34. In addition, a substream of the carrier gas Gc supplied from the carrier gas line 28 flows into the vent line 34 while the remainder flows into the joint flow line 32. At this point both reactant gas and carrier gas flow in the vent line 34.

Switching between the states shown in FIGS. 2(c) and (d) is repeated at high frequency in the process mode. Controlling this switching operation in such a manner that the corresponding valves in the first and second supply sections reside in opposite switched states results in the repetitive adsorption and reaction of the first reactant gas and the repetitive adsorption and reaction of the second reactant gas on the wafer W in the treatment compartment 12 and thereby enables the formation of the desired film by atomic layer deposition. It is desirable during switching between the first and second reactant gases to effect control in such a manner that a small amount of time is inserted during which the interior of the treatment compartment 12 is purged with carrier gas.

The ALCVD system described with reference to FIG. 1 and FIGS. 2(a) through (d) does not require opening and closing of the inline valve (valve disposed in the gas supply line to the treatment compartment) for switching between the first and second reactant gases. This enables high speed switching of the process gases without accompanying particulate contamination of the wafer W.

The flow rate in the needle valve NV-restricted vent line 34 can be set based on the following principles. First, the reactant gas flow rate required by the ALCVD treatment is determined in advance from the treatment conditions. Based on this reactant gas flow rate, the flow rate coefficient Cv of the flow rate restriction due to the needle valve NV can be calculated so the flow rate of the gas flowing in the vent line 34 is larger than the flow rate of the reactant gas. It can be assumed here that the pressure at the inlet to the needle valve NV is approximately equal to the pressure of the joint flow line 32 and that the pressure at the outlet is approximately equal to the pressure of the exhaust line 14 (which is significantly lower than the treatment pressure) of the CVD treatment section 10. The value of Cv can be readily derived using equation (1) if the aforementioned flow rate and pressures are known.

$$F = Cv \times 395 \times (Pu \times (Pu-Pd)/(d \times T))^{1/2} \qquad (1)$$

wherein:

F is the flow rate

Pu is the pressure at the inlet to the needle valve NV

Pd is the pressure at the outlet to the needle valve NV d is the gas density (SI unit)

Equation (1) holds only at conditions up to the speed of sound (Pu<2Pd), although a similar equation is also known at the speed of sound.

Modifications as described below can also be made in the ALCVD system of FIG. 1.

First, the carrier gas main line 28 can be combined with the first and second reactant gas lines 24a and 24b without being branched into the two carrier gas lines 28a and 28b. In this configuration, the joint flow positions Ja and Jb for the first and second reactant gas lines 24a and 24b are serially disposed on a single carrier gas main line 28.

In another modification, the reactant gas line and the carrier gas line (the first reactant gas line 24a and the first carrier gas line 28a pair and/or the second reactant gas line 24b and the second carrier gas line 28b pair) can each be directly connected to the treatment compartment without being combined along their course. In this configuration, the treatment compartment 12 itself functions as the joint flow position for the reactant gas line and carrier gas line. As necessary, a pressure controller that provides the same function as the pressure-control valve PV2 can be disposed in each line in order to set and maintain the back pressure in the particular line.

Suitable heating means can also be placed on any of the gas lines. This functions to prevent the possibility of liquefaction or adsorption of the reactant gas on or by the interior wall of the gas line.

In another modification, flow rate regulation of the gas in the reactant gas lines 24a and 24b can be effected by, for example, a mass flow controller, needle valve, or capillary tube, in place of the pressure-control valves PV1a and PV1b and calibrated orifices OR1a and OR1b shown in FIG. 1.

The term "reactant gas" is a generic designation for a variety of gases and mixed gases. Said mixed gases can be obtained by mixing two or more gases or by the addition to a carrier gas of a vapor produced from a liquid or solid. When, for example, a solid is used as the source (precursor), a cartridge loaded with the solid source can be placed upstream or downstream from the carrier gas flow rate control element of the reactant gas line.

Regulation of the pressure in the joint flow lines 32a and 32b becomes necessary when the pressure in the treatment compartment 12 is unsuitable for the generation of a pressure difference between the joint flow lines 32a and 32b and the vent lines 34a and 34b by the vent line setting means (needle valves NVa and NVb). Under such conditions, pressure controllers, for example, the pressure-control valves PV2a and PV2b shown by the dashed lines in FIG. 1, can be disposed upstream from the joint flow positions Ja and Jb. The pressure-control valve PV2 is omitted when said pressure-control valves PV2a and PV2b are present.

Three or more reactant gas lines can be provided in conformity with the structure in FIG. 1 when three or more reactant gases are required for the treatment being carried out in the treatment compartment 12. In such a case, a common carrier gas line can be used for two or more reactant gases or separate carrier gas lines can be used for each reactant gas, as a function of the reactivity of the reactant gases with each other.

Figure 3:
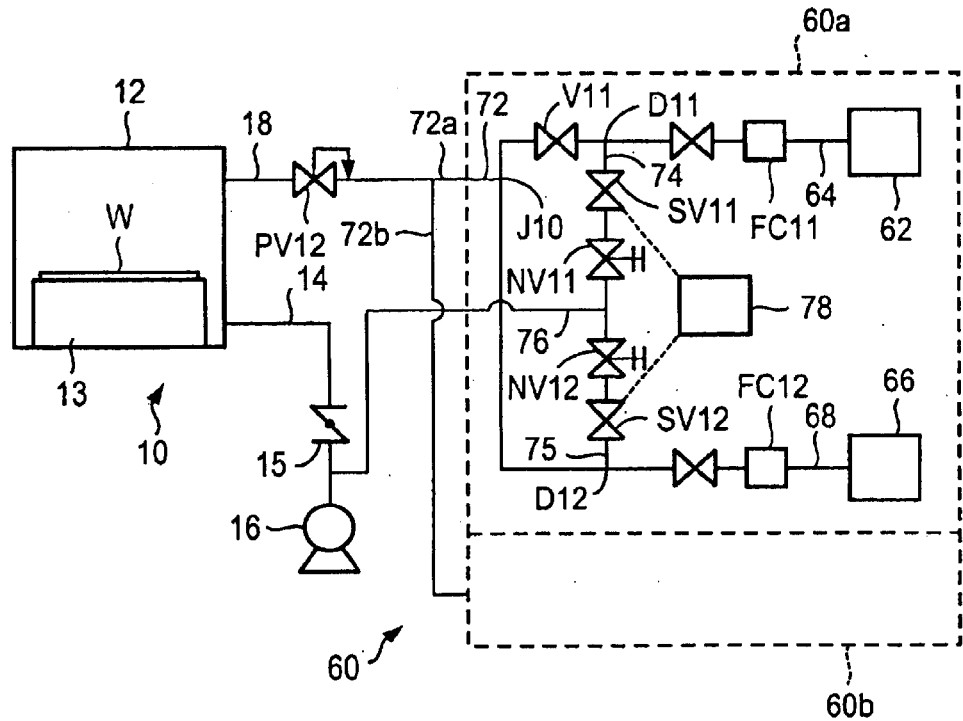
FIG. 3 contains a conduit layout that schematically illustrates an ALCVD system that employs a process gas supply mechanism that is another embodiment of this invention.

FIG. 3 contains a conduit layout diagram that schematically illustrates an ALCVD system that employs a process gas supply mechanism that is another embodiment of this invention. As shown in FIG. 3, this system is provided with a CVD treatment section 10 and a process gas supply section 60. Said process gas supply section 60 has a structure that switches between two reactant gases, wherein the reactant gases are supplied without being mixed into carrier gas. The CVD treatment section 10 has the same structure as in FIG. 1. The process gas supply section 60 comprises a first and second supply sections 60a and 60b corresponding to the first and second reactant gases. As for the process gas supply section 20 of FIG. 1, these two supply sections have entirely the same structure, operation, and principle, with the exception that their switching valves reside in opposite switched states. It is for this reason that only the first supply section 60a is illustrated in FIG. 3.

Each of the supply sections of the process gas supply section 60 contains a reactant gas line 64 for supplying reactant gas to the treatment compartment 12 from the reactant gas source 62 and a purge gas line 68 for supplying purge gas to the treatment compartment 12 from the purge gas source 66. The reactant gas line 64 and the purge gas line 68 are combined at position J10 to give the joint flow line 72. The first and second joint flow lines 72a and 72b from the first and second supply sections 60a and 60b are combined to give the supply line 18, which in turn is connected to the treatment compartment 12.

The present invention does not, however, require the combination of the first and second joint flow lines 72a and 72b with ensuing connection to the treatment compartment 12. Depending on the nature of the particular first and second reactant gases, it may be desirable to separately connect the first and second joint flow lines 72a and 72b to the treatment compartment 12.

The reactant gas vent line 74 is connected to the reactant gas line 64 at the branch position D11 upstream from the joint flow position J10. The purge gas vent line 75 is connected to the purge gas line 68 at the branch position D12 upstream from the joint flow position J10. The two vent lines 74 and 75 are combined along their course to give the joint flow vent line 76. This joint flow vent line 76 is connected to the exhaust line 14 from the CVD treatment section 10 between the butterfly valve 15 and the vacuum exhaust element 16.

A mass flow controller FC11 is disposed in the reactant gas line 64 upstream from the branch position D11, while a separation valve V11 is disposed in the reactant gas line 64 between the branch position D11 and the joint flow position J10. A mass flow controller FC12 is similarly disposed in the purge gas line 68 upstream from the branch position D12. The flow rates of the gases flowing in the gas lines 64 and 68 are regulated, respectively, by the mass flow controllers FC11 and FC12.

A pressure-control valve PV12 (automatic pressure regulator) is disposed in the supply line 18; this pressure-control valve PV12 functions to set and maintain the back pressure in the first and second joint flow lines 72a and 72b. However, the pressure-control valve PV12 can be omitted when a suitable pressure exists within the treatment compartment 12.

A solenoid-driven stop valve SV11 and a needle valve NV11 are disposed in the reactant gas vent line 74 in the sequence given considered from the upstream side. Similarly, a solenoid-driven stop valve SV12 and a needle valve NV12 are disposed in the purge gas vent line 75 in the sequence given considered from the upstream side. These stop valves SV11 and SV12 function as switching means for opening and closing, respectively, vent lines 74 and 75. The stop valves SV11 and SV12 comprise an NO valve (normally open valve) and NC valve (normally closed valve) combination, and their switching operation is effected simultaneously by the same signal. The needle valves NV11 and NV12 function as setting means, i.e., devices for changing and setting the flow rates of the gases flowing in, respectively, the vent lines 74 and 75. The stop valves SV11 and SV12 are desirably disposed upstream from the needle valves NV11 and NV12.

During CVD treatment, the flow rate vfm of the gas flowing in the reactant gas vent line 74 is set so as to satisfy the condition $mf<vfm<mf+sf$ wherein mf is the flow rate of the reactant gas supplied from the reactant gas line 64 and sf is the flow rate of the purge gas supplied from the purge gas line 68. The flow rate vfs of the gas flowing in the purge gas vent line 75 is set so as to satisfy the condition $sf<vfs<sf+mf$.

In addition, the pressures within the vent lines 74 and 75 at the outlets from the needle valves NV11 and NV12 are set below the pressure within the joint flow line 72. It is desirable in this regard for the vent lines 74 and 75 to be ultimately connected to the vacuum exhaust element 16 of the CVD treatment section 10.

The stop valves SV11 and SV12 are electrically driven through repetitive switching operations by the drive control element 78. This drive control element 78 functions as a common drive control element for both the first and second supply sections 60a and 60b. Drive control of the stop valves SV11 and SV12 in each supply section 60a and 60b is effected in such a manner that the switching operations of the valves are synchronized with the valves in opposite switched states. In addition, drive control of the corresponding valves between the first and second supply sections 60a and 60b, i.e., 60a-SV11 with 60b-SV11, 60a-SV12 with 60b-SV12, is effected in such a manner that the valves are synchronized and in opposite switched states.

Figure 4A:
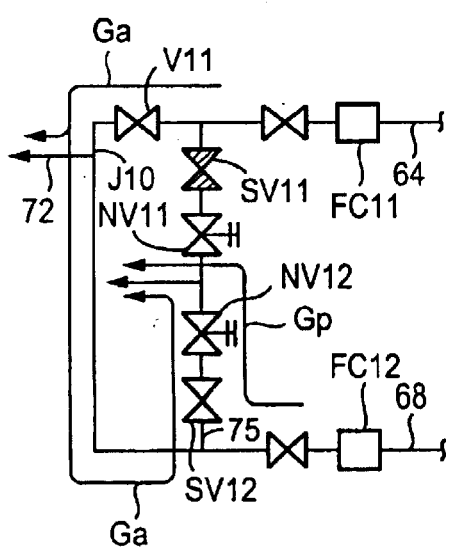
FIGS. 4(a) and (b) contain drawings that illustrate the operations that are carried out in the method for switching between the first and second reactant gases in the ALCVD system of FIG. 3.

The method for switching between the first and second reactant gases in the ALCVD system shown in FIG. 3 will now be explained. FIGS. 4(a) and (b) contain drawings that show the operations carried out in each supply section 60a and 60b during the process mode of the subject switching method. For the stop valves SV11 and SV12 the open state is denoted by a blank symbol and the closed state is denoted by a hatched symbol. As described above, in the process mode the flow rate vfm of the gas flowing in the reactant gas vent line 74 is set so as to satisfy the condition mf<vfm<mf+sf wherein mf is the flow rate of the reactant gas supplied from the reactant gas line 64 and sf is the flow rate of the purge gas supplied from the purge gas line 68. In addition, the flow rate vfs of the gas flowing in the purge gas vent line 75 is set so as to satisfy the condition sf<vfs<sf+mf. The pressures within the vent lines 74 and 75 at the outlets from the needle valves NV11 and NV12 are set.

As shown in FIG. 4(a), the valve SV11 is closed and the valve SV12 is open during the reactant gas supply period in the process mode. As a result of this configuration, all of the purge gas Gp supplied from the purge gas line 68 flows into the purge gas vent line 75. Since no gas is flowing into the reactant gas vent line 74, all of the reactant gas Ga supplied from the reactant gas line 64 flows to the joint flow position J10. From this joint flow position J10 a substream of the reactant gas Ga flows into the purge gas vent line 75, while the remainder flows into the joint flow line 72. That is, only reactant gas flows into the joint flow line 72 and is supplied to the treatment compartment 12. At this point a substream of the reactant gas and all of the purge gas are flowing into the purge gas vent line 75.

Figure 4B:
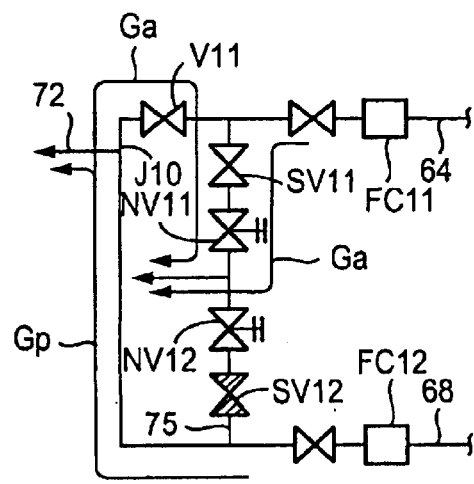

As shown in FIG. 4(b), the valve SV11 is open and the valve SV12 is closed during the period in which reactant gas is not supplied. As a result of this configuration, all of the reactant gas Ga supplied from the reactant gas line 64 flows into the reactant gas vent line 74. In addition, since gas does not flow into the purge gas vent line 75, all of the purge gas Gp supplied from the purge gas line 68 flows to the joint flow position J10. From the joint flow position J10 a substream of the purge gas Gp flows into the reactant gas vent line 74, while the remainder flows into the joint flow line 72. That is, only purge gas flows into the joint flow line 72 and is supplied to the treatment compartment 12. At this point a substream of the purge gas and all of the reactant gas are flowing in the reactant gas vent line 74.

Switching between the states shown in FIGS. 4(a) and (b) is repeated at high frequency in the process mode. Controlling this switching operation in such a manner that the corresponding valves reside in opposite switched states between the first and second supply sections 60a and 60b results in the repetitive adsorption and reaction of the first reactant gas and the repetitive adsorption and reaction of the second reactant gas on the wafer W in the treatment compartment 12 and thereby enables the formation of the desired film by atomic layer deposition. It is desirable during switching between the first and second reactant gases to effect control in such a manner that a small amount of time is inserted during which the interior of the treatment compartment 12 is purged with purge gas.

The ALCVD system described with reference to FIG. 3 and FIGS. 4(a) and (b) does not require opening and closing of the inline valve during switching between the first and second reactant gases. This enables high speed switching of the process gases without accompanying particulate contamination of the wafer W.

Figure 6:
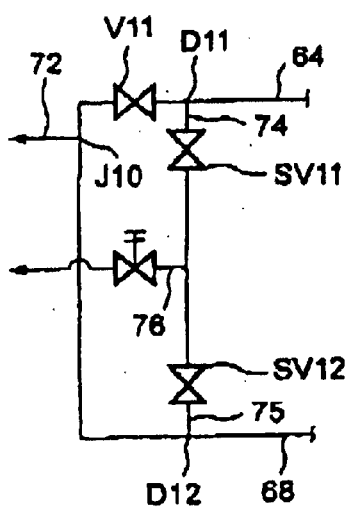
FIG. 6 contains a conduit layout that illustrates a modification example of the region comprising the reactant gas vent line and purge gas vent line in the ALCVD system of FIG. 3.

FIG. 6 contains a conduit layout that illustrates a modification example of the section in and around the reactant gas vent line 74 and purge gas vent line 75 of the ALCVD system illustrated in FIG. 3. The system in this modification example differs from the system illustrated in FIG. 3 in that the former employs a common needle valve NV13 as the means for setting both the flow rate in the reactant gas vent line 74 and the flow rate in the purge gas vent line 75. This structure is possible when the reactant gas flow rate is fairly close to the purge gas flow rate.

Figure 5:
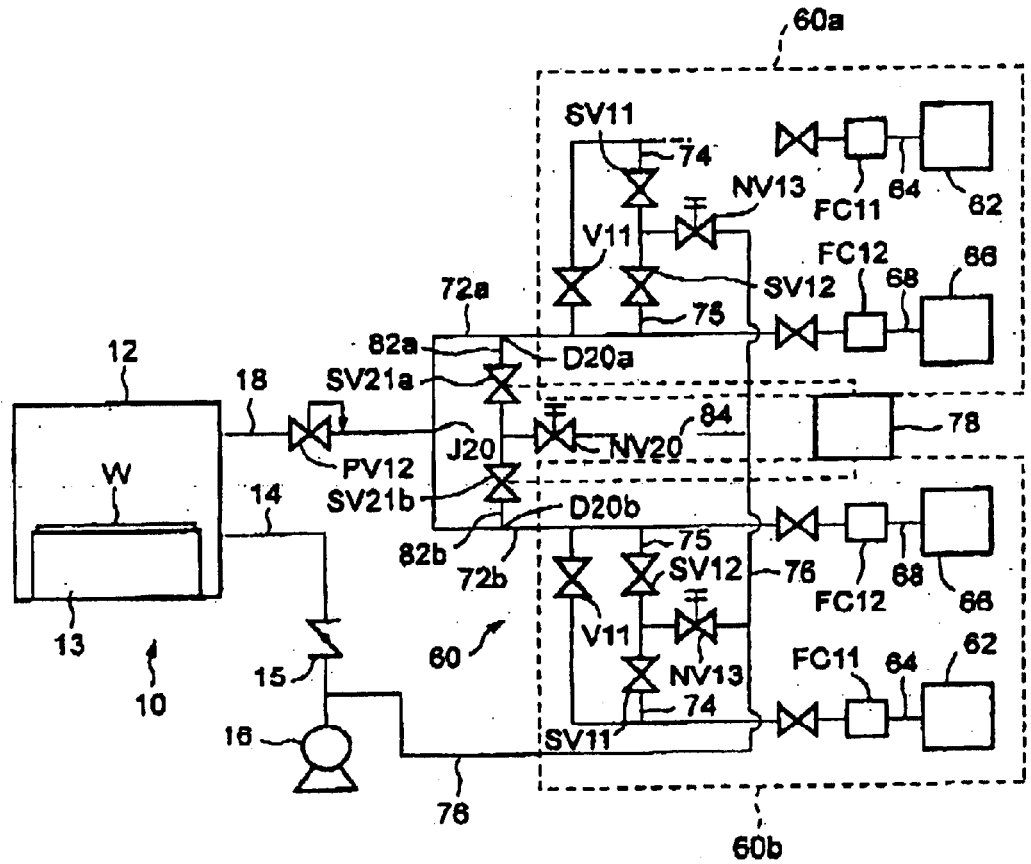
FIG. 5 contains a conduit layout that schematically illustrates an ALCVD system that uses a process gas supply mechanism that is yet another embodiment of this invention.

FIG. 5 contains a conduit layout that schematically illustrates an ALCVD system that uses a process gas supply mechanism that is yet another embodiment of this invention. The system in this embodiment characteristically represents the further development of the concept of the modification example illustrated in FIG. 6.

As illustrated in FIG. 5, the first and second joint flow lines 72a and 72b from the first and second supply sections 60a and 60b are themselves combined at the joint flow position J20 to give the supply line 18, which is connected to the treatment compartment 12. A first supply vent line 82a is connected to the first joint flow line 72a at the branch position D20a upstream from the joint flow position J20; a second supply vent line 82b is connected to the second joint flow line 72b at the branch position D20b upstream from the joint flow position J20. The two vent lines 82a and 82b are combined along their courses to give the common vent line 84, which is connected to the joint flow vent line 76.

Solenoid-driven stop valves SV21a and SV21b are disposed, respectively, in the first and second supply vent lines 82a and 82b. A needle valve NV20, which functions as a common means for setting the flow rates in the first and second supply vent lines 82a and 82b, is disposed in the common vent line 84. The flow rate f3 of the gas flowing in the common vent line 84 is thereby set so as to satisfy the conditions f1<f3<f1+f2 and f2<f3<f2+f1 wherein f1 is the flow rate of the gas supplied from the first joint flow line 72a and f2 is the flow rate of the gas supplied from the second joint flow line 72b.

The stop valves SV21a and SV21b on the first and second supply vent lines 82a and 82b are driven by a drive control element 78 that is common to the stop valves SV11 and SV12 of the first and second supply sections 60a and 60b. Specifically, drive control of the stop valves SV21a and SV21b is effected in such a manner that their switching operations are synchronized with the two valves residing in opposite switched states; this drive control is coordinated to the timing with which the first and second reactant gases alternately flow in the first and second joint flow lines 72a and 72b. As a consequence, the first and second reactant gases are alternately fed into the supply line 18, in this case without the admixture of purge gas.

Opening and closing of the inline valve is again not required for switching between the first and second reactant gases in the ALCVD system of FIG. 5. This enables high speed switching of the process gases without accompanying particulate contamination of the wafer W. This system also maintains an excellent treatment environment since the first and second reactant gases are entirely unmixed when fed into the supply line 18.

Figure 7:
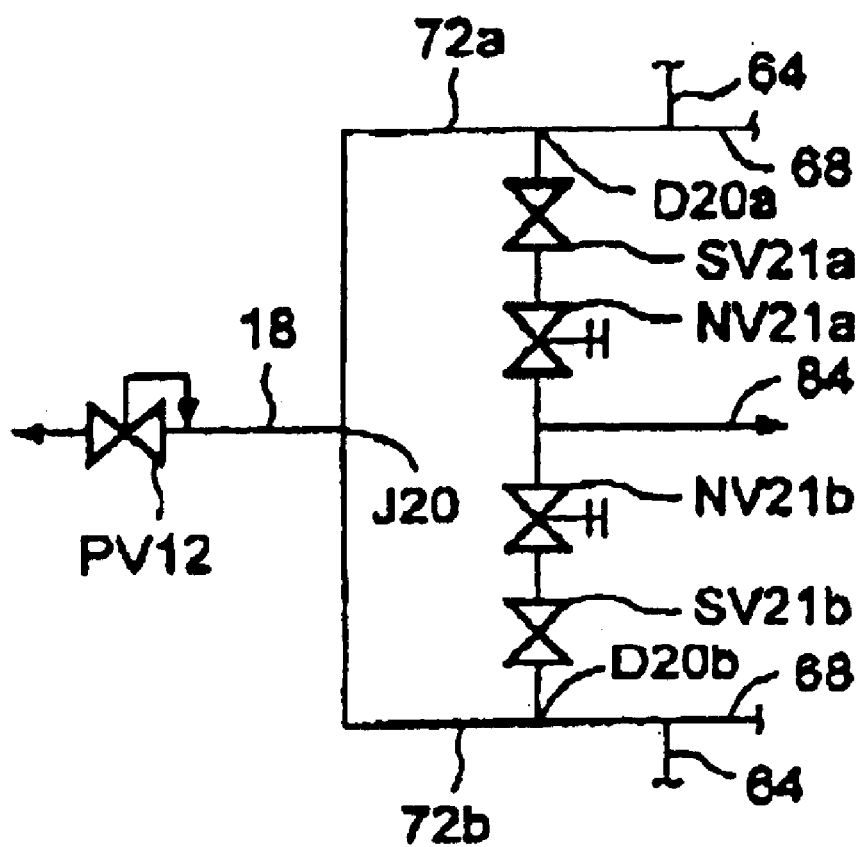
FIG. 7 contains a conduit layout that illustrates a modification example of the region comprising the first and second supply vent lines in the ALCVD system of FIG. 5.

FIG. 7 contains a conduit layout that illustrates a modification example in the region of the first and second supply vent lines 82a and 82b of the ALCVD system shown in FIG. 5. The modified system in FIG. 7 differs from the system in FIG. 5 in that needle valves NV21a and NV21b are disposed in the former as means for setting the flow rate in the first and second supply vent lines 82a and 82b, respectively. In this case, the flow rate f3a of the gas flowing in the first supply vent line 82a is set so as to satisfy the condition f1<f3a<f1+f2 wherein f1 is the flow rate of the gas supplied from the first joint flow line 72a and f2 is the flow rate of the gas supplied from the second joint flow line 72b. The flow rate f3b of the gas flowing in the second supply vent line 82b is also set so as to satisfy the condition f2<f3b<f2+f1.

As in FIGS. 5 and 7, first and second supply vent lines 82a and 82b can be added to the first and second joint flow lines 72a and 72b in the ALCVD system illustrated in FIG. 3. Moreover, the pressure-control valve PV12 can be omitted from the supply line 18 in the ALCVD systems of FIGS. 3 through 7 when the treatment compartment 12 resides at a suitable pressure. The structure of the ALCVD system of FIG. 1 and the structures described as possible modifications thereto can also be applied to the ALCVD systems of FIGS. 3 through 7 as long as no conflicts or contradictions are produced thereby.

While various modifications and alterations within the technical sphere of the concept of this invention can be devised by the individual skilled in the art, it should be understood that these modifications and alterations also fall within the scope of this invention.

Advantageous Effects of the Invention

As has been described in the preceding, this invention provides a process gas supply mechanism for ALCVD systems which can switch between supply and nonsupply of a process gas, or which can carry out high speed switching of the supply of a plural number of process gases, and which can in any case effect said switching without accompanying particulate contamination of the treatment substrate.

What is claimed is:

1. Process gas supply mechanism for ALCVD systems, wherein the ALCVD system is provided with a gastight treatment compartment that holds the treatment substrate and with a vacuum exhaust section that can exhaust said treatment compartment and is connected to the treatment compartment through an exhaust line, and wherein the process gas supply mechanism is connected to the treatment compartment in order to feed process gas into the treatment compartment, said process gas supply mechanism being characteristically provided with a first reactant gas line that can supply a flow rate-regulated first reactant gas; a first auxiliary gas line that can supply a flow rate-regulated first auxiliary gas; a first vent line, which is connected to the first reactant gas line upstream from a first position at which the first reactant gas flow is combined with the first auxiliary gas flow; a first vent setting means that is disposed in the first vent line and that can set the flow rate vf1 of the gas flowing in the first vent line so as to satisfy the condition mf1<vf1<sf1+mf1 wherein mf1 is the flow rate of the first reactant gas supplied from the first reactant gas line and sf1 is the flow rate of the first auxiliary gas supplied from the first auxiliary gas line; a first vent switching means that is disposed in the first vent line and that can open and close the first vent line; and a first drive control means that drives the first vent switching means in such a manner that the first vent switching means carries out its switching operation repetitively.

2. The process gas supply mechanism of claim 1 for ALCVD systems, that is characteristically also provided with a first joint flow line that can supply gas to the treatment compartment and that is formed by the combination at the aforesaid first position of the first reactant gas line and the first auxiliary gas line.

3. The process gas supply mechanism of claim 2 for ALCVD systems, that is characteristically also provided with a second reactant gas line that can supply a flow rate-regulated second reactant gas; a second auxiliary gas line that can supply a flow rate-regulated second auxiliary gas; a second joint flow line, which supplies gas to the treatment compartment and is formed by the combination at a second position of the second reactant gas line and the second auxiliary gas line; a second vent line, which is connected to the second reactant gas line upstream from said second position; a second vent setting means that is disposed in the second vent line and that can set the flow rate vf2 of the gas flowing in the second vent line so as to satisfy the condition mf2<vf2<sf2+mf2 wherein mf2 is the flow rate of the second reactant gas supplied from the second reactant gas line and sf2 is the flow rate of the second auxiliary gas supplied from the second auxiliary gas line; a second switching means that is disposed in the second vent line and that can open and close the second vent line; and a second drive control means that drives the second switching means in such a manner that the second switching means repetitively effects its switching operation in a regime synchronized with the switching operation of the first switching means that provides a switched state opposite from that of the first switching means.

4. Process gas supply mechanism according to claim 2 for ALCVD systems, characterized in that the reactant gas vent line and the auxiliary gas vent line are combined to form a joint flow vent line and the reactant gas vent setting means and auxiliary gas vent setting means comprise a common setting means that is disposed in said joint flow vent line.

5. Process gas supply mechanism according to claim 3 for ALCVD systems, characterized in that the first and second joint flow lines are themselves combined and thereafter connected to the treatment compartment through a supply line, and in that the process gas supply mechanism is additionally provided with a common pressure setting means that is disposed in the aforesaid supply line and can set the pressure in the first and second joint flow lines.

6. Process gas supply mechanism according to claim 3, characterized in that the first and second auxiliary gas lines branch from a common main line and a flow rate control means is disposed in said main line.

7. Process gas supply mechanism according to claim 3 for ALCVD systems, characterized in that the first and second drive control means are provided with a common drive control element.

8. Process gas supply mechanism according to claim 2 for ALCVD systems, characterized in that the vent switching means and vent setting means disposed in the same vent line comprise separate members and said vent switching means is disposed upstream from said vent setting means.

9. Process gas supply mechanism according to claim 2 for ALCVD systems, characterized in that the vent setting means comprises a device that can alter the flow rate of the gas flowing in the vent line.

10. Process gas supply mechanism according to claim 2 for ALCVD systems, characterized by connection of the vent line or lines to the exhaust line.

11. The process gas supply mechanism of claim 1 for ALCVD systems, that is characteristically also provided with a second reactant gas line that can supply a flow rate-regulated second reactant gas; a second auxiliary gas line that can supply a flow rate-regulated second auxiliary gas; a second joint flow line, which supplies gas to the treatment compartment and is formed by the combination at a second position of the second reactant gas line and the second auxiliary gas line; a second vent line, which is connected to the second reactant gas line upstream from said second position; a second vent setting means that is disposed in the second vent line and that can set the flow rate vf2 of the gas flowing in the second vent line so as to satisfy the condition mf2<vf2<sf2+mf2 wherein mf2 is the flow rate of the second reactant gas supplied from the second reactant gas line and sf2 is the flow rate of the second auxiliary gas supplied from the second auxiliary gas line; a second switching means that is disposed in the second vent line and that can open and close the second vent line; and a second drive control means that drives the second switching means in such a manner that the second switching means repetitively effects its switching operation in a regime synchronized with the switching operation of the first switching means that provides a switched state opposite from that of the first switching means.

12. Process gas supply mechanism according to claim 11 for ALCVD systems, characterized in that the first and second joint flow lines are themselves combined and thereafter connected to the treatment compartment through a supply line, and in that the process gas supply mechanism is additionally provided with a common pressure setting means that is disposed in the aforesaid supply line and can set the pressure in the first and second joint flow lines.

13. Process gas supply mechanism according to claim 11 characterized in that the first and second auxiliary gas lines branch from a common main line and a flow rate control means is disposed in said main line.

14. Process gas supply mechanism according to claim 11 for ALCVD systems, characterized in that the first and second drive control means are provided with a common drive control element.

15. Process gas supply mechanism according to claim 1 for ALCVD systems, characterized in that a pressure setting means is additionally disposed in the joint flow line in order to set the pressure in said joint flow line.

16. Process gas supply mechanism of claim 15 for ALCVD systems, characterized in that the pressure setting means comprises an automatic pressure regulator that maintains the pressure within the joint flow line at a set pressure.

17. Process gas supply mechanism according to claim 15 for ALCVD systems, characterized in that a pressure setting means is additionally disposed in the joint flow line in order to set the pressure in said joint flow line.

18. Process gas supply mechanism of claim 17 for ALCVD systems, characterized in that the pressure setting means comprises an automatic pressure regulator that maintains the pressure within the joint flow line at a set pressure.

19. Process gas supply mechanism according to claim 1 for ALCVD systems, characterized in that the vent switching means and vent setting means disposed in the same vent line comprise separate members and said vent switching means is disposed upstream from said vent setting means.

20. Process gas supply mechanism according to claim 1 for ALCVD systems, characterized in that the vent setting means comprises a device that can alter the flow rate of the gas flowing in the vent line.

21. Process gas supply mechanism according to claim 1 for ALCVD systems, characterized by connection of the vent line or lines to the exhaust line.

22. Process gas supply mechanism for ALCVD systems, wherein the ALCVD system is provided with a gastight treatment compartment that holds the treatment substrate and with a vacuum exhaust section that exhausts said treatment compartment and is connected to the treatment compartment through an exhaust line, and wherein the process gas supply mechanism is connected to the treatment compartment in order to feed process gas into the treatment compartment, said process gas supply mechanism being characteristically provided with a first reactant gas line that can supply a flow rate-regulated first reactant gas; a first auxiliary gas line that can supply a flow rate-regulated first auxiliary gas; a first joint flow line that supplies gas to the treatment compartment and is formed by the combination at a first position of the first reactant gas line and the first auxiliary gas line; a first reactant gas vent line, which is connected to the first reactant gas line upstream from the first position; a first auxiliary gas vent line, which is connected to the first auxiliary gas line upstream from the first position; a first reactant gas vent setting means that is disposed in the first reactant gas vent line and that can set the flow rate vf1m of the gas flowing in the first reactant gas vent line so as to satisfy the condition mf1<vf1m<mf1+sf1 wherein mf1 is the flow rate of the first reactant gas supplied from the first reactant gas line and sf1 is the flow rate of the first auxiliary gas supplied from the first auxiliary gas line; a first auxiliary gas vent setting means that is disposed in the first auxiliary gas vent line and that can set the flow rate vf1s of the gas flowing in the first auxiliary gas vent line so as to satisfy the condition sf1<vf1s<sf1+mf1; a first reactant gas vent switching means that is disposed in the first reactant gas vent line and that can open and close the first reactant gas vent line; a first auxiliary gas vent switching means that is disposed in the first auxiliary gas vent line and that can open and close the first auxiliary gas vent line; and a first drive control means that drives the first reactant gas vent switching means and the first auxiliary gas vent switching means, in such a manner that the first reactant gas vent switching means and the first auxiliary gas vent switching means carry out their switching operations repetitively in a regime synchronized to each other that provides opposite switched states for the two means.

23. The process gas supply mechanism of claim 22 for ALCVD systems, that is characteristically additionally provided with a second reactant gas line that can supply a flow rate-regulated second reactant gas; a second auxiliary gas line that can supply a flow rate-regulated second auxiliary gas; a second joint flow line, which supplies gas to the treatment compartment and is formed by the combination at a second position of the second reactant gas line and the second auxiliary gas line; a second reactant gas vent line, which is connected to the second reactant gas line upstream from said second position; a second auxiliary gas vent line, which is connected to the second auxiliary gas line upstream from said second position; a second reactant gas vent setting means that is disposed in the second reactant gas vent line and that can set the flow rate vf2m of the gas flowing in the second reactant gas vent line so as to satisfy the condition mf2<vf2$m$ <mf2+vf2 wherein mf2 is the flow rate of the second reactant gas supplied from the second reactant gas line and vf2 is the flow rate of the second auxiliary gas supplied from the second auxiliary gas line; a second auxiliary gas vent setting means that is disposed in the second auxiliary gas vent line and that can set the flow rate vf2$s$ of the gas flowing in the second auxiliary gas vent line so as to satisfy the condition vf2<vf2$s$ <vf2+mf2; a second reactant gas vent switching means that is disposed in the second reactant gas vent line and that can open and close the second reactant gas vent line; a second auxiliary gas vent switching means that is disposed in the second auxiliary gas vent line and that can open and close the second auxiliary gas vent line; and a second drive control means that can drive the second reactant gas vent switching means and the second auxiliary gas vent switching means, in such a manner that the second reactant gas vent switching means and the second auxiliary gas vent switching means carry out their switching operations repetitively in a regime synchronized to each other that provides opposite switched states for the two means and synchronized to the switching operations of the first reactant gas vent switching means and the first auxiliary gas vent switching means and providing opposite switched states therefrom.

24. The process gas supply mechanism of claim 23 for ALCVD systems, that is characteristically additionally provided with a supply line which is formed by the combination at a third position of the first and second joint flow lines and which supplies gas to the treatment compartment; a first supply vent line, which is connected to the first joint flow line upstream from the third position; a second supply vent line, which is connected to the second joint flow line upstream from the third position; a first supply vent setting means, which is disposed in the first supply vent line and can set the flow rate f3$a$ of the gas flowing in the first supply vent line so as to satisfy the condition f1<f3$a$<f1+f2 wherein f1 is the flow rate of the gas supplied from the first joint flow line and f2 is the flow rate of the gas supplied from the second joint flow line; a second supply vent setting means, which is disposed in the second supply vent line and can set the flow rate f3$b$ of the gas flowing in the second supply vent line so as to satisfy the condition f2<f3$b$<f2+f1; a first supply vent switching means that is disposed in the first supply vent line and that can open and close the first supply vent line; a second supply vent switching means that is disposed in the second supply vent line and that can open and close the second supply vent line; and a third drive control means that can drive the first supply vent switching means and the second supply vent switching means through repetitive switching operations according to a regime in which the first supply vent switching means and the second supply vent switching means are synchronized and in opposite switched states.

25. The process gas supply mechanism of claim 24 for ALCVD systems, characterized in that the first and second supply vent lines are combined to form a common vent line and the aforesaid first and second supply vent setting means comprise a common setting means that is disposed in said common vent line.

26. Process gas supply mechanism according to claim 22 for ALCVD systems, characterized in that the reactant gas vent line and the auxiliary gas vent line are combined to form a joint flow vent line and the reactant gas vent setting means and auxiliary gas vent setting means comprise a common setting means that is disposed in said joint flow vent line.

* * * * *